United States Patent [19]

Chan et al.

[11] Patent Number: 4,868,138

[45] Date of Patent: Sep. 19, 1989

[54] METHOD FOR FORMING A SELF-ALIGNED SOURCE/DRAIN CONTACT FOR AN MOS TRANSISTOR

[75] Inventors: Tsiu C. Chan, Carrollton; Yu-Pin Han, Dallas, both of Tex.

[73] Assignee: SGS-Thomson Microelectronics, Inc., Carrollton, Tex.

[21] Appl. No.: 172,299

[22] Filed: Mar. 23, 1988

[51] Int. Cl.⁴ .................. H01L 21/265; H01L 21/283; H01L 21/308

[52] U.S. Cl. ........................ 437/44; 437/189; 437/195; 437/41; 437/228; 156/643; 156/644

[58] Field of Search ............... 437/29, 30, 34, 41, 437/43, 44, 45, 189, 195, 203, 228, 238, 913, 984; 156/643, 644

[56] References Cited

U.S. PATENT DOCUMENTS

4,288,256 9/1981 Ning et al. ........................ 437/43
4,610,078 9/1986 Matsukawa et al. ............... 437/41
4,640,000 2/1987 Sato ................................. 437/29
4,727,038 2/1988 Watabe et al. ..................... 437/29

Primary Examiner—David L. Lacey
Assistant Examiner—Andrew J. Anderson
Attorney, Agent, or Firm—Kenneth C. Hill; Gregory M. Howison; Richard K. Robinson

[57] ABSTRACT

A process for forming electrical interconnect on MOS semiconductor integrated circuits includes the formation of a capping layer of oxide over the first level poly layer prior to patterning. The capping layer is then removed over selected regions. The conductive layer and capping oxide layer are then patterned to form transistor gates and interconnect. Source/drain regions are formed in active areas of the integrated circuit, and sidewall oxide is formed next to the patterned gate regions. When a second layer of interconnect is formed and patterned over the integrated circuit, contact between the first and second interconnect layers is made in the previously defined selected regions.

13 Claims, 5 Drawing Sheets

METHOD FOR FORMING A SELF-ALIGNED SOURCE/DRAIN CONTACT FOR AN MOS TRANSISTOR

TECHNICAL FIELD OF THE INVENTION

The present invention pertains in general to forming contacts in an integrated circuit and, more particularly, to a method for forming the contact to the source and the drain regions of an MOS transistor.

CROSS REFERENCE TO RELATED APPLICATIONS

This application is related to co-pending patent application Ser. No. 07/172,145, filed concurrent therewith and entitled "Method for Forming an Upper Metal Level Contact in a Multilevel Semiconductor Structure".

BACKGROUND OF THE INVENTION

Conventional MOS FET devices are typically comprised of a gate electrode overlying a channel region and separated therefrom by a gate oxide. Conductive regions are formed in the substrate on either side of the gate electrode and the associated channel to form the source and drain regions. However, the major portion of the source and drain regions is utilized to provide a conductive path to the source and drain junctions. The dimensions of the source and drain regions are a function of the design layout and the photolithographic steps required to align the various contact masks, the alignment tolerances, etc.

Conventionally, an MOS transistor is fabricated by first forming the gate electrode and then the source and drain regions followed by depositing a layer of interlevel oxide over the substrate. Contact holes are then patterned by a separate mask and contact holes cut through the interlevel oxide to expose the underlying source and drain regions. This separate mask step requires an alignment step whereby the mask is aligned with the edge of the gate electrode which is also the edge of the channel region. There is, of course, a predefined alignment tolerance which determines how far from the edge of the gate electrode the ideal location of the contact. For example, if the alignment tolerance were 1 micron, this would mean that the contact wall would be disposed one micron from the edge of the gate electrode on one side and one micron from the edge of the nearest structure on the opposite side thereof. This therefore results in a source or drain region having a dimension of two microns plus the width of the contact. The overall width is therefore defined by alignment tolerances, the width of the conductive interconnection and the minimal separation from adjacent structures. This therefore results in a significant amount of surface area dedicated primarily to mask alignment.

When MOS devices are utilized in a complementary configuration such as CMOS devices, the additional space required to account for alignment tolerances becomes more of a problem. This is due to the fact that CMOS devices inherently require a greater amount of substrate and surface area than either functionally equivalent Nor P-channel FET devices. For example, the CMOS device density in an integrated circuit can be up to 40% less than the device density achieved by using conventional NMOS technology.

This size disadvantage is directly related to the amount of substrate surface area required for alignment and processing latitudes in the CMOS fabrication procedure to insure that the N- and P-channel transistors are suitably situated with respect to the P-well. Additionally, it is necessary to isolate the N- and P-channel transistors from each other with fixed oxide layers with an underlying channel stop region. As is well known, these channel stops are necessary to prevent the formation of parasitic channels between neighboring transistors. Typically, the channel stops are highly doped regions formed in the substrates surrounding each transistor and effectively block the formation of parasitic channels by substantially increasing the substrate surface inversion threshold voltage. Also, they are by necessity the opposite in conductivity type from the source and drain regions they are disposed adjacent to in order to prevent shorting. This, however, results in the formation of a highly doped, and therefore, low reverse breakdown voltage P-N junctions. Of course, by using conventional technology with the channel stops, there is a minimum distance by which adjacent transistors must be separated in order to prevent this parasitic channel from being formed and to provide adequate isolation.

SUMMARY OF THE INVENTION

The present invention disclosed and claimed herein comprises a process for forming self-aligned contacts extending from a second and upper structural level to a first and lower structural level on a substrate. The process includes first forming a conformal layer of conductive material at the first structural level and then forming a cap layer of insulating material over the surface of the conducting layer. The combined conducting layer and insulating layer are then patterned and etched to define a conductive structure with the insulating layer forming a protective cap on the surface thereof, the conductive structure having at least one substantially vertical surface. A sidewall insulating layer is then formed on the substantially vertical surface of the conductive structure to a predetermined thickness. The outer surfaces of the sidewall insulating material form the contact hole or via. A second layer of conductive material is then formed in the second structural level and insulated from the first conductive layer by the protective cap layer of insulating material. The second layer of conductive material is then patterned and etched to define a conductive pattern at the second level.

In another embodiment of the present invention, the first structural level has at least one active region, the active region being surrounded by a layer of thick insulating material. The conductive structure is comprised of a transistor gate which is separated from the surface of the active region by a layer of gate insulating material. The gate electrode has two substantially vertical surfaces which each have a layer of sidewall insulating material disposed thereon. A light dosage of impurities of conductivity type opposite to that of the substrate is introduced into the surface of the substrate prior to the formation of the sidewall insulating layers. After formation of the sidewall insulating layers, a heavy dose of impurities of a conductivity type opposite to that of the substrate is then introduced into the substrate to form heavy implant portions of the source/drains of the transistor. The second layer of conductive material is then deposited and patterned to form the source/drains of the transistor.

In yet another embodiment of the present invention, the thick insulating layer and the active regions are formed by first forming a thick layer of field oxide over the substrate and then patterning the field oxide layer to form the active regions. The thick oxide layer is etched to form the active regions such that the boundaries of the active regions at the thick oxide layer comprise substantially vertical surfaces of insulating material. The substantially vertical surfaces are covered with the sidewall insulating layer at the same time the substantially vertical surfaces of the gate electrodes are covered with the sidewall insulating layer. Therefore, the light dosage of impurities extends under the sidewall insulating layer whereas the heavy implant portions are spaced away from the substantially vertical surfaces of the thick oxide layer.

In a further embodiment of the present invention, the cap layer of insulating material is patterned and etched down to the surface of the first layer of conductive material to expose the surface thereof at preselected locations. Thereafter, the second layer of conductive material can directly contact the surface of the first layer of conductive material without requiring a separate contact hole pattern.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
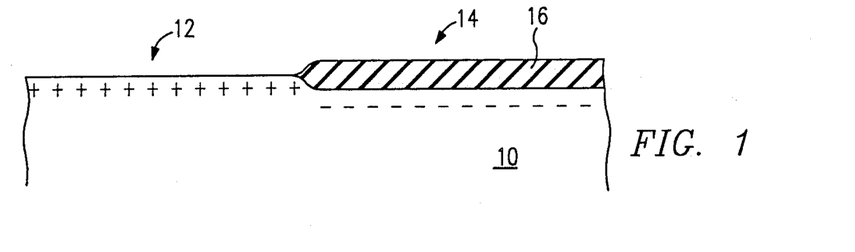
FIG. 1, illustrates a cross-sectional diagram of the initial substrate after the N- and P-well implants.

Referring now to FIG. 1, a silicon substrate 10, which in the preferred embodiment, is prepared for use in a CMOS process. The substrate 10 has an N-well and a P-well region defined thereon. The P-well region is generally referred to by the reference numeral 12 and the N-well is generally referred to by the reference numeral 14. Thereafter, the substrate is patterned with a protective nitride cap (not shown) over the P-well 12, and then N-type impurities implanted into the N-well region 14. The substrate is then subjected to a steam oxidation step to grow a thick layer of oxide 16 over the N-well region 14. The nitride cap (not shown) is then stripped away and P-type impurities implanted into the P-well region 12. The energy of the P-well implant is insufficient to go through the oxide layer 16.

Figure 2:
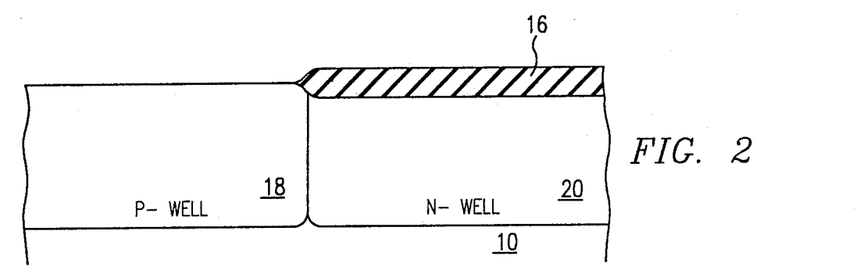
FIG. 2 illustrates a cross-sectional diagram of a substrate after the N- and P-well implants have been driven down to form the N- and P-wells.

Referring now to FIG. 2, after implanting of the P-well region 12 and the N-well region 14, the implanted impurities are driven down into the substrate 10 to form a P-well 18 and an N-well 20. The layer of oxide 16 is then stripped off.

Figure 3:
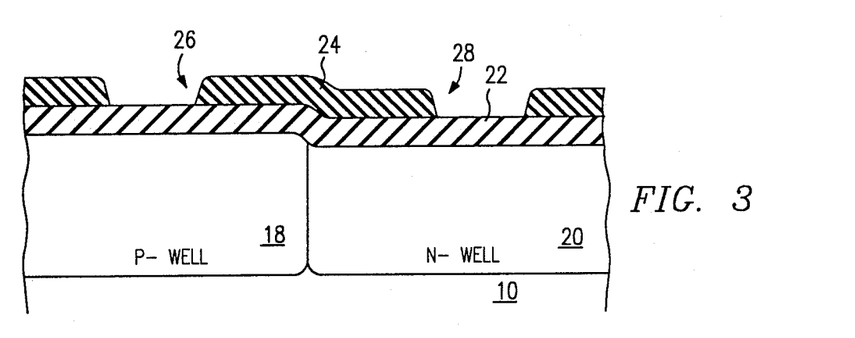
FIG. 3 illustrates a cross-sectional diagram of the substrate of FIG. 2 with a layer of thick oxide grown over the substrate and patterned to form the active areas.

Referring now to FIG. 3, after formation of the P-well 18 and N-well 20, the substrate is subjected to a steam oxidation process and a thick layer of oxide 22 is grown over the entire substrate 10 to a thickness of approximately 5,000 Å. A layer of photoresist 24 is then deposited on the substrate and patterned to form an active region 26 over the P-well 18 and an active region 28 over the N-well 20.

Figure 4:
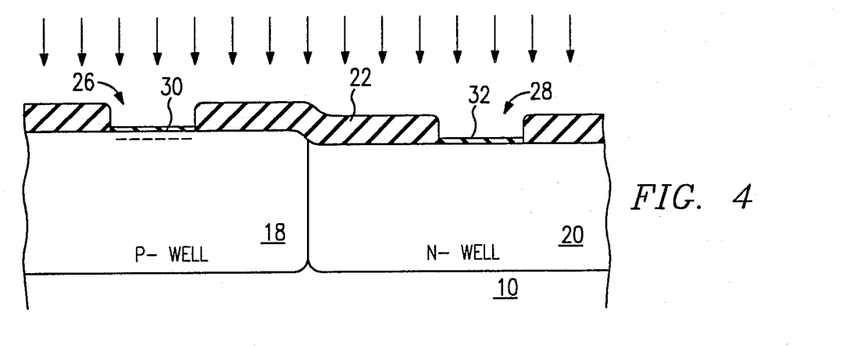
FIG. 4 illustrates a cross-sectional diagram of the substrate of FIG. 3 after etching the active area and adjusting the $V_T$ in the P-well.

Referring now to FIG. 4, the substrate 10, after patterning, is subjected to a plasma etch whereby the portions of the oxide layer 22 in the active regions 26 and 28, respectively, are removed down to the surface of the substrate, resulting in substantially vertical walls bounding the active regions. A thin layer of gate oxide is then deposited or grown over the substrate to a thickness of approximately 200 Å, resulting in a layer of gate oxide 30 in the active region 26 and a layer of gate oxide 32 in the active region 28. The N-well region 14 is then masked off (not shown) leaving P-well 18 open and then N-channel transistor threshold voltage adjust impurities implanted into the active region 26 to adjust the threshold of active devices formed therein.

Figure 5:
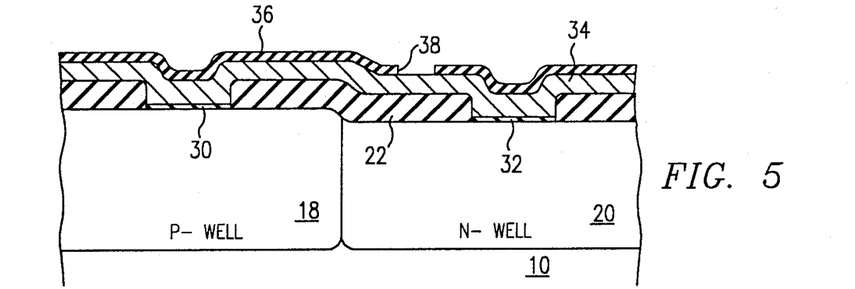
FIG. 5 illustrates a cross-sectional diagram of the substrate of FIG. 4 with a layer of polycrystalline silicon conformally coating the substrate followed by an upper layer of oxide.

Referring now to FIG. 5, after the threshold adjust in the P-well 18, a layer of polycrystalline silicon 34 is deposited over the substrate to form a conformal layer which has a thickness of approximately 4,000 Å. The poly layer 34 is then doped with N-type impurities to increase the conductance thereof. A layer of oxide 36 is then deposited over the poly layer 34 to a thickness of approximately 2,000 Å. For reasons described hereinbelow, the upper surface of the oxide layer 36 is patterned to provide an opening 38 therein to expose the underlying polysilicon layer 34 in a region overlying the thick oxide layer 22. However, the opening 38 can also be disposed over one of the active regions 26 or 28, as will be described hereinbelow.

Figure 6:
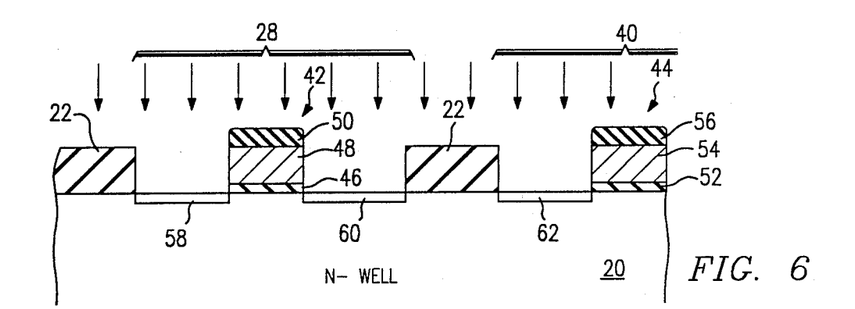
FIG. 6 illustrates a cross-sectional diagram of a portion of the substrate of FIG. 5 after patterning and etching the gate electrodes and lightly implanting the source and drain regions.

Referring now to FIG. 6, the additional steps required to form a transistor in each of the active regions 26 and 28 will be described with reference only to the formation of a transistor in the active region 28 in N-well 20. For illustrative purposes, an additional active region 40 is illustrated in the N-well 20 which was not illustrated in FIGS. 3-5. After the layer of poly 34 has been formed with the protective oxide layer 36 on the upper surface thereof, gate electrodes are patterned and formed with a gate electrode 42 formed in the active region 28 and a gate electrode 44 formed in the active region 40. The gate electrode 42 is comprised of a layer of gate oxide 46 formed from the oxide layer 32, a layer of doped polycrystalline silicon 48 formed from the poly layer 34 and a capping layer of protective oxide 50 formed from the oxide layer 36. Similarly, the gate electrode 44 is comprised of a gate oxide layer 52, a poly layer 54 and a protective oxide layer 56.

From a dimensional standpoint, the gate electrodes 42 and 44 are each approximately 0.8 microns in width, corresponding to the channel length of 0.8 microns with the source and drain regions defined on either side thereof having a width of approximately 1.0 microns. That is, the distance between the edge of the gate electrode to the edge of the oxide layer 22 is approximately 1.0 microns, this region being the available space within which to make contact to. As will be described hereinbelow, with the process of the present invention, the portion of the oxide layer 22 isolating the two active regions 28 and 40 can be as small as 1.0 microns and still provide sufficient isolation.

After formation of the gate electrodes 42 and 44, a light dosage of P-type impurities are implanted into the exposed region of the substrate on either side of the electrodes 42 and 44. The P-type impurities, in the preferred embodiment, are Boron and are implanted to a dosage of approximately 1E13 ions/cm$^2$, resulting in an implanted layer after an annealing step with a thickness of approximately 0.15 microns. During this implantation step, the portion of the substrate 10 in which the P-well 18 was formed is masked off with a subsequent implant step of N-type impurities utilized to form the lightly doped source and drain regions for the transistors to be formed therein. This results in source/drain regions 58 and 60 being formed in the active region 28 on either side of gate electrode 42 and a source/drain region 62 being formed in the active region 40, the other source/drain region not being illustrated.

Figure 7:
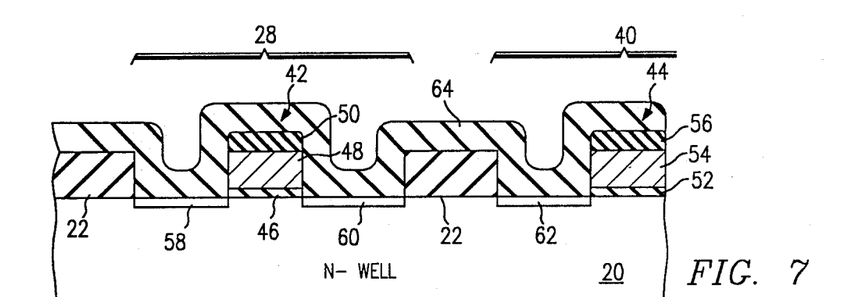
FIG. 7 illustrates a cross-sectional diagram of the substrate of FIG. 6 with a layer of conformal oxide deposited over the substrate.

Referring now to FIG. 7, after formation of the source/drain regions 58-62, a conformal layer of oxide 64 is deposited over the substrate to a thickness of approximately 3,000 Å. It is important to note that the thickness of the oxide over the poly portion 48 of the electrode 42 and the poly portion 54 of the electrode 44 is now approximately 5,000 Å, due to the thickness of the oxide layers 50 and 56, which were formed from the oxide layer 36, illustrated in FIG. 5.

Figure 8:
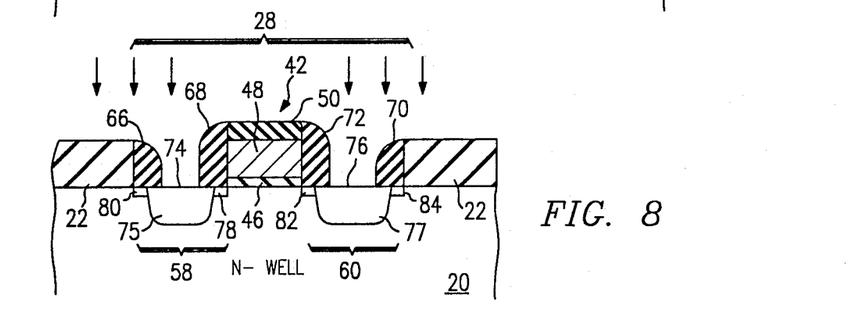
FIG. 8 illustrates a cross-sectional diagram of the substrate of FIG. 7 after anisotropically etching the oxide layer and implanting the source/drain regions.

Referring now to FIG. 8, after formation of the oxide layer 64 over the substrate, the surface of the structure on the substrate 10 is then subjected to an anisotropic etch. For illustrative purposes, only the active region 28 and the transistor formed therein will be described. The anisotropic etch is substantially unidirectional and etches primarily in the vertical direction with the oxide on any substantially vertical surfaces remaining. This results in a layer of sidewall oxide disposed on all vertical surfaces to a thickness of approximately 3,000 Å. As described above, since only 3,000 Å of oxide was disposed over the substrate, it is only necessary to etch the surface for a duration of time sufficient to remove 3,000 Å of oxide. This will allow at least a portion of the capping protective oxide layer 50 to remain over the poly layer 48 of gate electrode 42. This results in a layer of sidewall oxide 66 being formed over the vertical surface of the portion of the thick oxide layer 22 adjacent the source/drain region 58, a layer of sidewall oxide 68 disposed over the vertical surface of the gate electrode 42 adjacent the source/drain region 58, a layer of sidewall oxide 70 disposed over the vertical surface of the portion of the thick oxide layer 22 adjacent the source/drain region 60 and a layer of sidewall oxide 72 disposed over the vertical surface of the gate electrode 42 adjacent the source/drain region 60. Since each of the source/drain regions 58 and 60 initially had a width of approximately 1.0 micron, the distance between the outer surfaces of the sidewall oxide layers 66, 6, 72 and 70 respectively, is approximately 0.25 microns. This results in a contact opening 74 being formed over the source/drain region 58 and a contact opening 76 being formed over the source/drain region 60 contact openings 74 and 76 dimensioned to be approximately 0.5 microns.

After formation of the contact openings 74 and 76 over the source/drain regions 58 and 60 respectively, a heavy dosage of P-type impurities is then implanted through the openings 74 and 76. The dosage is approximately 2E15 ions/cm$^2$ of a Boron impurity at an energy sufficient to form source/drain heavy implant regions 75 and 77 with each region 75 and 77 having a thickness of approximately 0.3 microns after a subsequent annealing and drive step. It should be noted that during the drive step there is some lateral movement of the heavy dosage implants. This results in a heavy implant with a light reach-through implant on both sides of the source/drain region. The source/drain region 58 has a reach-through implant region 78 to connect the heavy implant region 75 to the channel region underlying the gate electrode 42 and a light implant region 80 formed on the opposite side of the heavy implant region 75 to connect the heavy implant region 75 to the edge of the thick oxide layer 22. In a similar manner, the source/drain region 60 has a lightly implanted reach-through implant region 82 disposed between the heavy implant region 77 and the edge of the channel region underlying the gate electrode 42, and a reach-through implant region 84 for connecting the heavy implant region 77 to the edge of the thick oxide layer 22. As will be described hereinbelow, the reachthrough implant regions 80 and 84 are useful in the isolation of adjacently disposed transistors. The lightly doped regions 78 and 82 are functional to form a lightly doped drain (LDD) transistor.

Figure 9:
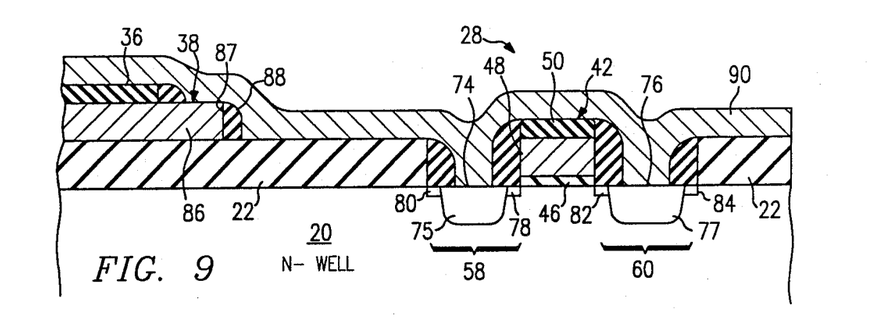
FIG. 9 illustrates a cross-sectional diagram of the substrate of FIG. 8 after depositing the second conductive layer of silicide over the substrate.

Referring now to FIG. 9, there is illustrated a detail of the active region 28 and the opening 38 in the oxide layer 36 illustrated in FIG. 5. It can be seen that during patterning of the poly layer 34 to form the gate electrodes 42 and 44, a portion 86 is also formed from the poly layer 34 which is utilized to provide interconnections with other structures on the substrate, over which the opening 38 is formed. It should be noted that the portion 86 is formed within the opening 38 such that an edge 87 is exposed. In accordance with the previously described process steps, the portion of the oxide layer 36 on the inside of the opening 38 has a sidewall oxide layer formed on the vertical surfaces thereof in addition to a sidewall oxide layer 88 formed over the edge 87 of the portion 86 of the poly layer 34 for isolation purposes.

After implanting of the source/drain regions 58 and 60 and subsequent implantation of the source/drain regions (not shown) in the P-well 18, a second conductive layer of silicide 90 is deposited on the substrate to form a conformal layer which has a thickness of approximately 4,000 Å. The silicide layer 90 is formed by conventional techniques utilizing either a deposited silicide such as tantalum silicide or forming the silicide after deposition of a refractory metal layer such as titanium to form $TiSi_2$. The second conductive layer of silicide 90 contacts the substrate in the contact openings 74 and 76 and also contacts the surface of the first layer of poly 34 on the portion 86 through opening 38. Therefore, contact openings which were formed through the use of the sidewall oxide layers are fabricated in a single step to expose both the surface of the silicon and select surfaces of the first layer of poly. The oxide layer 36 which formed the oxide layer 50 on the gate electrode 42 provides an important function of selectively isolating the upper surfaces of the first layer of poly 34, with the sidewall oxide layers isolating the vertical surfaces. Thus, a self-aligned step is provided which requires no additional patterning and associated alignment step to open the contact holes. This is an important aspect of the present invention.

From an alignment standpoint, the mask utilized to pattern gate electrode 42 and the mask utilized to fabricate a conventionally formed contact hole are typically aligned with the same alignment mark. If the gate electrode 42 is misaligned for any reason in one direction and the contact hole is misaligned in the opposite direction, a cumulative error results. This error must be accounted for by providing additional space between the edge of the gate electrode and the edge of the active region. However, utilizing the process of the present invention, the spacing provided by the sidewall oxide layers 70 and 72, which sidewall oxide layers are self-aligned with respect to the edge of the gate electrode 42, no alignment step is required, thus allowing the contact hole to be spaced away from the edge of the gate electrode 42 by a smaller distance.

Figure 10:
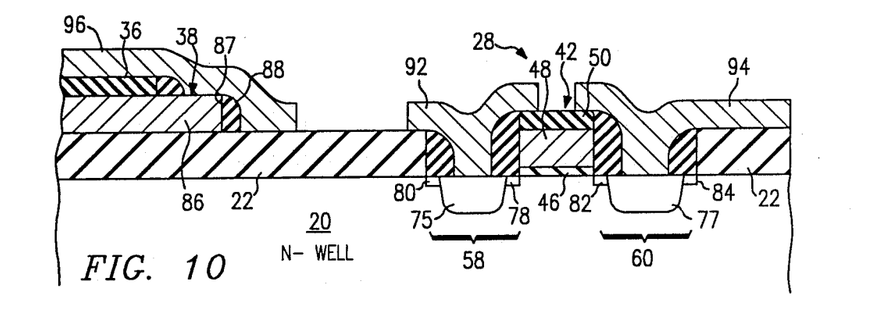
FIG. 10 illustrates a cross-sectional diagram of the substrate of FIG. 9 after patterning and etching of the second conductive layer.

Referring now to FIG. 10, after depositing the silicide layer 90 over the substrate, the layer 90 is patterned and etched to form a contact 92 to the region 75 of the source/drain region 58, a contact 94 to the region 77 of the source/drain region 60 and a contact 96 to the portion 86 of the first layer of poly 34. It should be understood that the gate electrode 42 can extend back over the substrate and be contacted by the second layer of silicide 90 in a similar manner to the method by which the contact 96 contacts the portion 86. In addition, it should be noted that the contact 96 overlaps the portion 86 and sidewall oxide layer 88.

It can be seen that after formation of the contacts 92 and 94 between the second level silicide layer 90 and the source/drain regions 58 and 60, respectively, the contacts are spaced away from the gate electrode 42 by a predefined distance in addition to being spaced away from the vertical wall of the thick oxide layer 22 by the same predefined distance. This predefined distance is the thickness of the sidewall oxide layer. Since the reach-through implant or light dosage of impurities was introduced into the substrate 10 prior to formation of the sidewall oxide layers 66–72, the result is that the contacts 92 and 94 and the source/drain heavy implant regions 75 and 77 are spaced a predetermined distance from both gate electrode 42 and from the thick oxide layer 22. With respect to the transistor, this forms the increased breakdown voltage of the well-known LDD transistor. However, it can be seen that a thick field transistor is also formed which is an LDD transistor. One parameter that is important in an integrated circuit is the threshold voltage of the thick field transistor. With the process of the present invention, it is possible to provide more closely spaced transistors while insuring that the contacts and the heavy implant are spaced away from the edge of the thick oxide layer 22 by a predetermined distance and from the edge of the gate electrode 42 by a predetermined distance. For example, the alignment mask for the active region and the thickness of the sidewall oxide layer determine the distance that the contact 60 is spaced away from the gate electrode 42.

Figure 11:
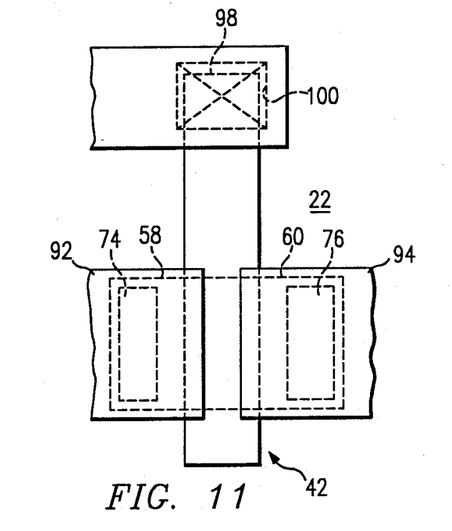
FIG. 11 illustrates a top view of one transistor in the substrate of FIG. 10.

Referring now to FIG. 11 there is illustrated a top-view layout of the transistor formed in active region 28 on the substrate 10, wherein like numerals refer to like parts in the various figures. It can be seen that the gate electrode 42 runs over the substrate and extends up over the oxide layer 22 to form a contact pad 98 on one end thereof similar to portion 86. A contact opening 100 is formed over the contact pad 98 through the oxide layer 36 which covers the gate electrode 42 to expose the underlying polycrystalline silicon. The contact opening 100 is formed by the same process utilized to form the opening 38. It should be understood that the dimensions of this contact opening 100 are a result of an initial contact opening having the vertical surfaces thereof covered by approximately 3,000 Å of sidewall oxide.

As illustrated in FIG. 11, the contact area 100 is greater than the dimensions of the contact pad 98, and, therefore, overlaps the contact pad. This is distinctly different from the situation where the contact was smaller than the overall dimension of the contact pad. This was typically referred to as a "dog-bone" structure. With the process of the present invention, the size of the contact opening 100 which corresponds to the contact opening 38 in FIGS. 1–10, defines the actual conductive opening or potential conductive opening to which the structure in the second level silicide 90 can contact through. It is therefore not necessary to have a contact pad that is larger than the contact opening itself, thus decreasing the amount of space that must be dedicated to the contact pad.

The contact openings 74 and 76 are illustrated in phantom lines, which phantom lines represent the spacing distance from the edge of the gate electrode 42 and the edge of the thick oxide layer 22. It can be seen that the location of the edges of the contact openings 74 and 76 are a function only of the relative alignment of the mask utilized to form the gate electrode 42 and the mask utilized to form the initial openings defining the active areas 26 and 28. However, the distance from the edge of the gate electrode 42 to the edge of the contact openings 74–76 and the edge of the thick oxide layer 22 to the edge of the contact openings 74–76 is not mask related. Therefore, because orientation does not affect these dimensions, the actual contact to the underlying silicon is spaced a predetermined distance away from either the insulating thick oxide layer 22 or the gate electrode 42. This is to be compared with prior processes wherein a contact mask was aligned with respect to predetermined alignment marks and any misalignment of the alignment mask with respect to either the first poly layer mask or the mask defining the active regions would result in movement of the contact openings with respect to the edge of the gate electrode 42 and the edge of the thick oxide layer 22.

Figure 12:
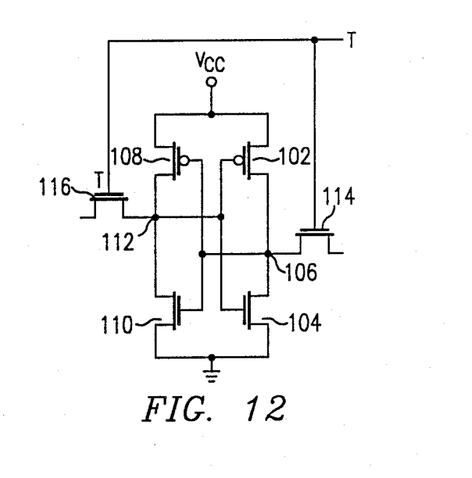
FIG. 12 illustrates a schematic diagram of a 6-T static ram cell.

Referring now to FIG. 12, there is illustrated a schematic of a six transistor static memory cell which is fabricated utilizing the process of the present invention. The static memory cell is comprised of a CMOS pair with a P-channel transistor 102 and an N-channel transistor 104 having the gates thereof tied together and the drain of the P-channel transistor 102 and the drain of the N-channel transistor 104 being connected to an output node 106. A second CMOS pair having a P-channel transistor 108 and an N-channel transistor 110 is provided with the gates thereof tied together, and the drain of the P-channel transistor 108 and the drain of the N-channel transistor 110 connected to a node 112. The gates of the first CMOS pair are connected to the node 112 and the gates of the second CMOS pair are connected to the node 106. The sources of both N-channel transistors 104 and 110 are connected to ground and the sources of both P-channel transistors 102 and 108 are connected to the supply voltage $V_{cc}$. A transfer N-channel transistor 114 is provided with the source-to-drain path thereof connected between the node 106 and an output with the gate thereof connected to a transfer signal. A second N-channel transfer transistor 116 is provided having the source-to-drain path thereof connected between node 112 and an output terminal with the gate thereof connected to the transfer signal.

Figure 13:
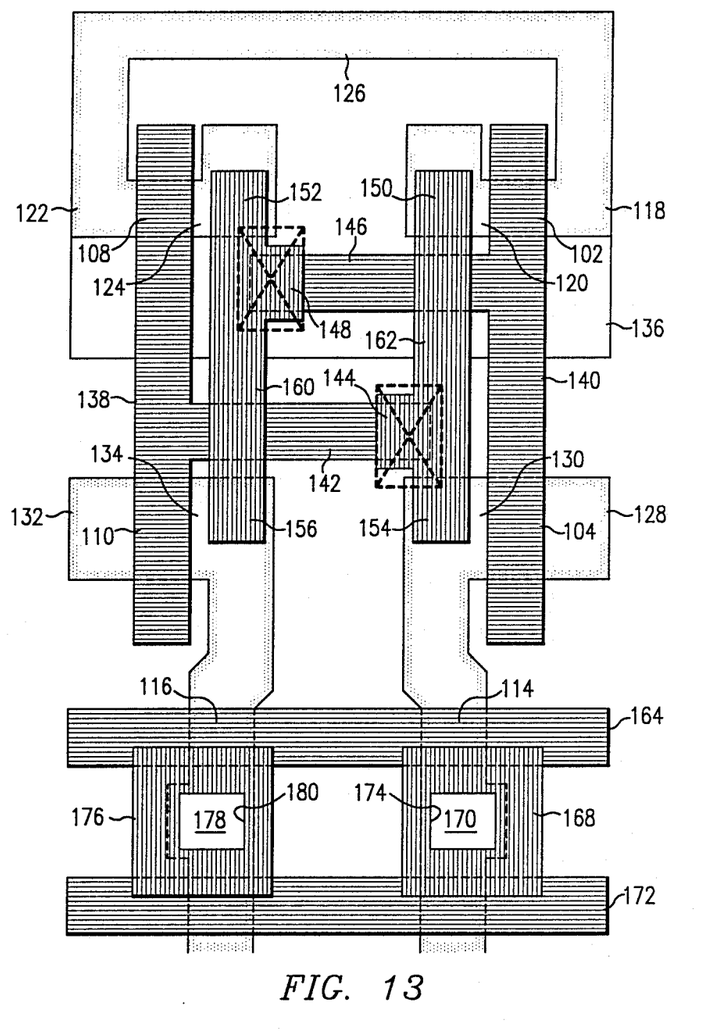
FIG. 13 illustrates a top view of the 6-T cell of FIG. 12 fabricated utilizing the process of the present invention.

Referring now to FIG. 13, there is illustrated a layout of the 6-T cell of FIG. 12 utilizing the process of the present invention. The P-channel transistor 102 has a source 118 and a drain 120 and the P-channel transistor 108 has a source 122 and a drain 124. The sources 118 and 122 are connected together through a common region 126 formed during the source/drain implant of the P-channel transistors 102 and 108. In a similar manner, the N-channel transistor 104 has a source 128 and a drain 130 and N-channel transistor 110 has a source 132 and a drain 134. The N-well is defined by a border 136.

The gates of the P-channel transistor 108 and the N-channel transistor 110 are formed with a single run of polycrystalline silicon 138 which is formed from the first level of poly. In a similar manner, the gates of the P-channel transistor 102 and the N-channel transistor 104 are formed from a second run of polycrystalline silicon 140 formed from the first layer of poly. The poly run 138 extends over the channel region to form the gate electrode of the transistor 108 and also over the channel region in the transistor 110 to form the gate electrode therein. An interconnecting portion 142 extends outward from the run 138 and has a contact opening 144 formed in the end thereof. An interconnecting portion 146 extends outward from the run 140 and has a contact opening 148 disposed in the end thereof. The contact openings 144 and 148 represent openings in the protective oxide layer covering the poly runs 138 and 140 and the interconnecting portions 142 and 146. This protective oxide covers the entire layer of poly in the first level poly.

The drain of P-channel transistor 102 has a self-aligned contact opening 150 formed thereto in accordance with the present invention described above and the drain 124 has a self-aligned contact opening 152 formed thereto. In a similar manner, the drain of N-channel transistor 104 has a self-aligned contact opening 154 formed thereto and the drain of the N-channel transistor 110 has a self-aligned contact opening 156 formed thereto. It can be seen that the self-aligned contact openings are disposed away from the edge of the gates and the boundary edges of the thick oxide layer, which boundaries define the source/drain regions.

The interconnects formed between the nodes 106 and 112 and the opposite CMOS pairs are formed in a second level of silicide disposed over the first level of poly and separated therefrom by a combination of the oxide layer over the first level of poly and the sidewall oxide layers formed on the vertical walls in accordance with the present invention. The contact 152 and the contact 156 between the drain of P-channel transistor 108 and the drain of N-channel transistor 110 are connected together by a run of second level poly 160. Additionally, a contact is formed through contact opening 148 to provide connection of the second level silicide 160 with the poly run 146. A second run 162 of second level silicide is provided for connection between the self-aligned contact opening 150 and the self-aligned contact opening 154 for the drain of P-channel transistor 102 and the drain of N-channel transistor 104, respectively, and also for being connected to the contact opening 144 for providing a connection conduction with the poly run 142 in the first level poly.

The N-channel transistors 114 and 116 are fabricated during formation of the first level poly with a run of poly 164, with the source/drain path of transistor 114 connected to the drain 130 of transistor 104 and the source/drain path of transistor 116 connected to the drain of transistor 110. The sources of transistors 104 and 110 are connected together through a run of another metal level, not shown, to ground.

The other side of the source-to-drain paths of transistors 114 and 116 are connected to a metal level interconnect, not shown, to provide the bit line. In order to provide a metal level interconnect, a contact pad 168 fabricated from the second level of silicide is formed over a contact opening 170. The contact opening 170 is formed by the sidewall oxide disposed on the edges of the active region and the edges of the poly run 164 forming the gates of transistors 114 and 116. The contact pad 160 overlaps both the poly run 164 and a poly run 172, the poly run 172 forming the access transistors on another and adjacent 6T cell. The contact pad 168 provides a conductive surface to which the upper metal level interconnect is connected through a contact opening 174. The contact opening 174 represents the ideal contact opening wherein a contact opening is formed through a layer of interlevel oxide (not shown). If, for some reason, there were a misalignment, the contact opening 174 would be biased toward one edge of the contact pad 168. It can be seen that the contact pad 168 increases the available contact area for the metal level interconnect without increasing the area of the source/drain of the transistor underlying the contact pad 168. This is due to the fact that the contact pad 168 can overlie adjacent layers of the first level poly, such as poly run 164 and poly run 172.

The transistor 116 and the source/drain thereof which is provided for contacting the bit line has a contact pad 176 formed similar to the contact pad 168. The contact pad 176 provides the increased contact area for the metal level interconnect and interfaces with a contact opening 178 in the underlying source/drain. A contact opening 180 is provided for contacting the interconnect metal level (not shown).

Figure 14:
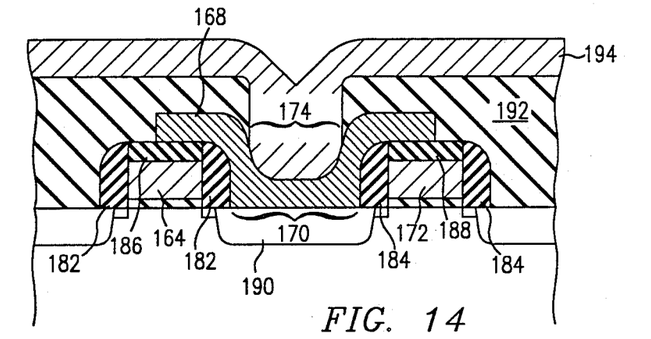
FIGS. 14 and 15 illustrate a cross-sectional diagram and perspective view, respectively, of the metal level to second conductive level interconnect.
Figure 15:
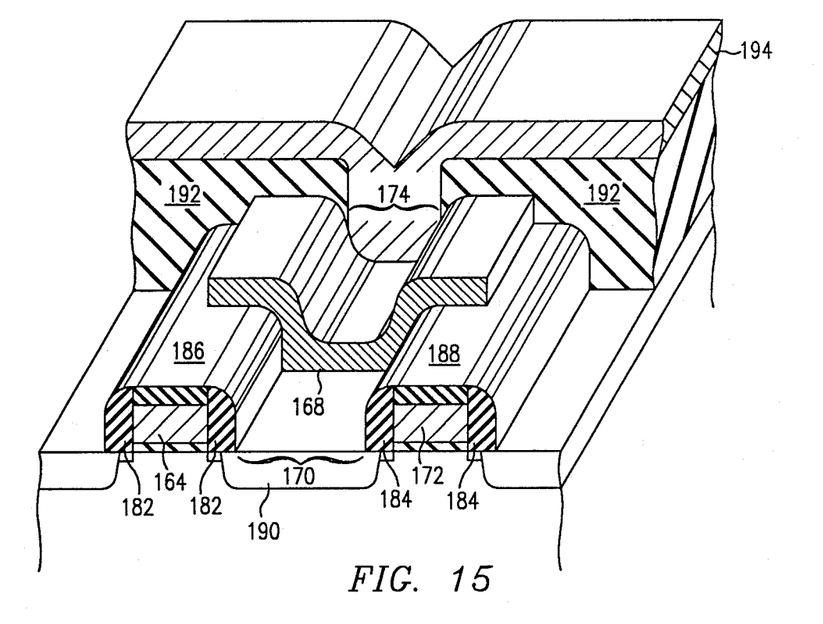

Referring now to FIGS. 14 and 15, there is illustrated a cross-sectional diagram and perspective view, respectively, of the portion 168 taken along lines 14—14 in FIG. 13 and illustrating the metal level interconnect. The poly run 164 is bounded on either side thereof by sidewall oxide layers 182 with the poly run 172 being bounded on either side thereof by sidewall oxide layers 184. The upper portion of poly run 164 is protected by a protective oxide cap 186 and the upper surface of poly run 172 is protected by a protective oxide cap 188. Layers 186 and 188 are fabricated from the protective oxide layer 36, as illustrated in FIG. 4. The channel regions underlying the gates formed with the poly runs 164 and 172 are separated from each other by a common source/drain well 190. The contact 170 is therefore formed between the exterior surface of the sidewall oxide layers 182 and 184 overlying the source/drain 190.

After formation of the contact opening 170, the second level silicide is disposed over the surface and patterned to form the contact pad 168. It can be seen that the contact pad 168 has a significantly larger surface area than the contact opening 170. Thereafter, a layer of interlevel oxide 192 is formed over the surface and then planarized. The contact 174 in the form of a via is formed through the interlevel oxide 192. A layer of metal 194 is then sputtered onto the surface and patterned to form the interconnect at the metal level. It can be seen that the use of the contact pad 168 formed from the second level silicide serves to increase the area to which the contact opening 174 is aligned to. In this manner, the area of the contact opening 170 can be decreased since the portion 168 in effect amplifies the contact 170 at the second level without requiring the increased surface area at the first level.

In summary, there has been provided a process for forming self-aligned contacts which are aligned in one embodiment to the edge of a conductor and in one embodiment to the edge of a vertical surface of the isolation field oxide. The process includes first defining a conductive structure in an active region which has at least one vertical surface. A layer of conformal oxide is then disposed over the substrate and anisotropically etched to form sidewall layers on the vertical surfaces. The conductive structure is initially fabricated with a protective cap of oxide thereon such that the entire conductive structure is encased in a protective oxide. The sidewall oxide layer on the vertical surface forms one surface of the contact via. Thereafter, the contact is formed by depositing a layer of conductive material over the substrate and then patterning it and etching it to form contacts.

Although the preferred embodiment has been described in detail, it should be understood that various changes, substitutions and alterations can be made therein without departing from the spirit and scope of the invention as defined by the appended claims.

What is claimed is:

1. A method for forming contact holes from a first structural level in a semiconductor structure to a second structural level therein, comprising:

forming a first layer of conductive material at the first structural level on a semiconductor substrate;

forming a capping layer of insulating material over the first conductive layer at the first structural level to provide a protective insulating layer thereon, the second structural level above the upper surface of the capping lever;

patterning the capping layer to define a first contact region;

removing the patterned portions of the capping layer of insulating material to expose the upper surface of the first conductive layer in the first contact region, the exposed first contact region bounded by substantially vertical walls of the capping layer, the first contact region extending from the second structural level to the upper surface of the first conductive layer;

patterning the capping layer and the first conductive layer to define a predetermined conductive structure and removing the patterned portions to form the conductive structure, with the conductive structure having at least one substantially vertical wall with the first contact region being part of the conductive structure;

forming a conformal layer of insulating material over the conductive structure at the first structural level; and anisotropically etching the conformal insulating layer in a primarily vertical direction to expose the surface of the substrate adjacent to the substantially vertical wall of the conductive structure and spaced apart therefrom by the thickness of the remaining portion of the conformal layer of insulating material such that the portion of the conformal insulating layer on the substantially vertical walls of the conductive structure and the capping layer bounding the first contact region are not removed;

wherein the portion of the capping layer remaining on the conductive structure and the insulating sidewall layer electrically insulate the conductive portion of the conductive structure;

wherein the outer surfaces of the insulating sidewall layer provide the sidewalls of a second contact region from the second structural level to the exposed surface of the substrate, and the sidewalls of the first contact region.

2. The method of claim 1 wherein the step of patterning the capping layer and the layer of conductive material comprises:

defining a pattern on the upper surface of the capping layer of insulating material; and etching the capping layer and layer of conductive material down to the surface of the substrate at the first structural level in accordance with the defined pattern.

3. The method of claim 1 wherein the capping layer of insulating material and the conformal layer of insulating material comprise silicon dioxide and the semiconductor substrate comprises a silicon based material.

4. The method of claim 1 and further comprising:

forming a layer of thick oxide over the substrate prior to forming the first conductive layer; and patterning and etching the thick oxide layer to define isolating portions of the thick oxide layer having substantially vertical walls such that the isolating portions are apart of the first structural level and adjacent the second contact region;

wherein isolating sidewall layers of the conformal layer of insulating material are formed on the substantially vertical walls of the isolating portions of the thick oxide layer to space the second contact region away from the edge of the isolating portion of the thick oxide layer by the thickness of the isolating sidewall layers.

5. The method of claim 1 and further comprising:

forming a second conformal layer of conductive material over the semiconductor substrate after formation of the first and second contact regions and the sidewall insulating layers; and patterning the second layer of conductive material to form contacts in the first and second contact regions.

6. A method for forming contacts from a second, upper structural level to a first, lower structural level in a semiconductor structure, said semiconductor structure including a semiconductor substrate, comprising:

forming a layer of thick oxide over the semiconductor substrate;

patterning the thick oxide layer to define at least one active region of the first level and bounded by the thick oxide layer;

forming a first conformal layer of conductive material on at least a portion of the active region, the first conductive layer having an insulating capping layer disposed on the upper surface thereof;

forming a selective opening in the capping layer to expose the underlying first conductive layer in a predetermined region, the selective opening having substantially vertical walls on the boundaries thereof;

patterning the first conductive layer to form a conductive structure overlying at least a portion of the surface of the active region, the conductive structure having at least one substantially vertical wall and spaced apart from the edges of the thick oxide layer at the boundary of the active region and including the selective opening, the second structural level being above the capping layer;

forming sidewall insulating layers on the substantially vertical wall of the conductive structure and the substantially vertical walls of the selective opening;

forming a second conformal layer of conductive material at the second structural level and extending down to the first structural level and contacting the exposed surfaces of the active region proximate to the conductive structure and associated sidewall insulating layers and extending down through the selective opening to contact the upper surface of the first conductive layer; and patterning the second conformal layer of conductive material in accordance with a predetermined pattern to form conductive contacts from the second structural level to the first structural level to contact the surface of the substrate in the active region proximate to the conductive structure with the associated sidewall insulating layer and contacting the surface of the first conductive layer, with the outer surfaces of the sidewall insulating layers forming the boundaries of contact openings and the capping layer on the upper surface of the conductive structure electrically isolating the first conductive layer in the conductive structure from the second conformal layer of conductive material.

7. The method of claim 6 wherein the step of forming the active region comprises:

forming a layer of thick oxide to a predetermined thickness on the surface of the substrate prior to the formation of the first conductive layer;

forming a masking layer on the upper surface of the thick oxide layer to define the active region; and selectively removing the portion of the thick oxide layer overlying the active region defined by the masking layer to form substantially vertical walls in the thick oxide layer at the boundary of the active region and surrounding the active region.

8. The method of claim 7 and further comprising forming sidewall insulating layer on the substantially vertical walls of the thick oxide layer prior to forming the second conformal layer of conductive material at the second structural level.

9. The method of claim 6 wherein the conductive structure further includes a layer of insulating material disposed between the conductive layer and the surface of the active region, and the conductive structure comprises the gate electrode of a transistor having a substantially vertical surface on a source side of the gate electrode and a substantially vertical surface on the drain side of the gate electrode and further comprising:

introducing a light dosage of impurities of the opposite type from the substrate into the surface of the active region on either side of the gate electrode;

the step of forming the sidewall insulating layer on the substantially vertical surfaces of the conductive structure comprising forming the sidewall insulating layer on the substantially vertical surfaces of the gate electrode on both the source and the drain side; and introducing a high dosage of impurities of the opposite conductivity type from the substrate into the active region on either side of the gate electrode after formation of the sidewall insulating layers, the dosage sufficient to form source/drain contacts.

10. The method of claim 9 wherein the method of introducing the light dosage of impurities and the heavy dosage of impurities comprises ion implantation techniques.

11. The method of claim 6 wherein the step of forming the sidewall insulating layer on the substantially vertical surfaces of the conductive structure and the selective opening comprises:

forming a conformal layer of oxide of a predetermined thickness over the surface of the conductive structure and the active region; and anisotropically etching the conformal layer of oxide primarily in the vertical direction for a predetermined amount of time required to remove at least the conformal layer of oxide on the horizontal surfaces, such that the capping layer of insulating material in the conductive structure is not completely removed and the exposed surface of the active region is spaced apart from the substantially vertical surface of the conductive structure by the thickness of the conformal layer of oxide and the exposed surface of the first conductive layer in the selective opening is spaced apart from the substantially vertical surfaces of the selective opening.

12. The method of claim 6 wherein the step of forming the first conductive layer comprises depositing a layer of silicide over the exposed surface of the active region and the step of forming the layer of insulating material comprises depositing a layer of silicon dioxide, the substrate being silicon.

13. A method for forming an MOS transistor in an integrated circuit with self-aligned contacts, comprising:

forming active regions in a substrate, each active region bounded by a thick insulating layer;

forming a layer of gate insulating material over the active region and thick insulating layer;

forming a first conformal layer of conductive material over the surface of the layer of gate insulating material;

forming a capping layer of insulating material over the first layer of conductive material;

removing a selected region of the capping layer of insulating material to expose the surface of the underlying first layer of conductive material, the selected region bounded by substantially vertical surfaces;

patterning and etching the combined layers of gate insulating material, first layer of conductive material and capping layer of insulating material to form a gate electrode in the active region having substantially vertical sidewalls, wherein the gate electrode includes the selected region;

introducing a light dose of impurities of opposite conductivity type to the conductivity type of the substrate into the active region on both sides of the gate electrode to form lightly doped source/drain regions;

forming a layer of sidewall insulating material on the substantially vertical sidewalls of the gate electrode to a predetermined thickness;

introducing a heavy dose of impurities of a conductivity type opposite to the conductivity type of the substrate into the active region on both sides of the gate electrode to form heavily doped source/drain regions;

forming a second conformal layer of conductive material over the gate electrode, active regions, sidewall insulating layers and thick insulating layer such that the second layer of conductive material contacts the surface of the active region spaced away from the gate electrode by approximately the thickness of the sidewall insulating material, and wherein the second layer contacts the surface of the first layer of conductive material in the selected region; and patterning and etching the second layer of conductive material in accordance with a predetermined pattern to provide a connective pattern and contacts from a second level above the surface of the substrate to the heavily implanted source/drain regions.

* * * * *